United States Patent
Kanamitsu

(10) Patent No.: US 7,569,313 B2
(45) Date of Patent: Aug. 4, 2009

(54) WHITE DEFECT REPAIRING METHOD AND APPARATUS OF PHOTOMASK, MANUFACTURING METHOD OF PHOTOMASK, AND MANUFACTURING METHOD OF SEMICONDUCTOR DEVICE

(75) Inventor: Shingo Kanamitsu, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 371 days.

(21) Appl. No.: 11/640,927

(22) Filed: Dec. 19, 2006

(65) Prior Publication Data

US 2007/0166629 A1    Jul. 19, 2007

(30) Foreign Application Priority Data

Dec. 20, 2005    (JP)    ................ 2005-366649

(51) Int. Cl.
*G03F 1/00*    (2006.01)
(52) U.S. Cl. ........................................... 430/5
(58) Field of Classification Search .................. 430/5, 430/30, 394
See application file for complete search history.

(56) References Cited

U.S. PATENT DOCUMENTS 5,514,198 A * 5/1996 Bayle et al. .................. 65/42
2005/0136341 A1 * 6/2005 Park et al. ..................... 430/5

FOREIGN PATENT DOCUMENTS

JP    2002-244276    8/2002
JP    2003-121991    4/2003

\* cited by examiner

*Primary Examiner*—Stephen Rosasco
(74) *Attorney, Agent, or Firm*—Finnegan, Henderson, Farabow, Garrett & Dunner, L.L.P.

(57) ABSTRACT

According to an aspect of the invention, there is provided a white defect repairing method of a photomask which repairs a white defect present at an edge portion of a pattern of the photomask, the method including forming a groove or a hole having a tilted side wall which inhibits passage of exposure light at a position corresponding to that of the white defect on a translucent substrate of the photomask.

11 Claims, 8 Drawing Sheets

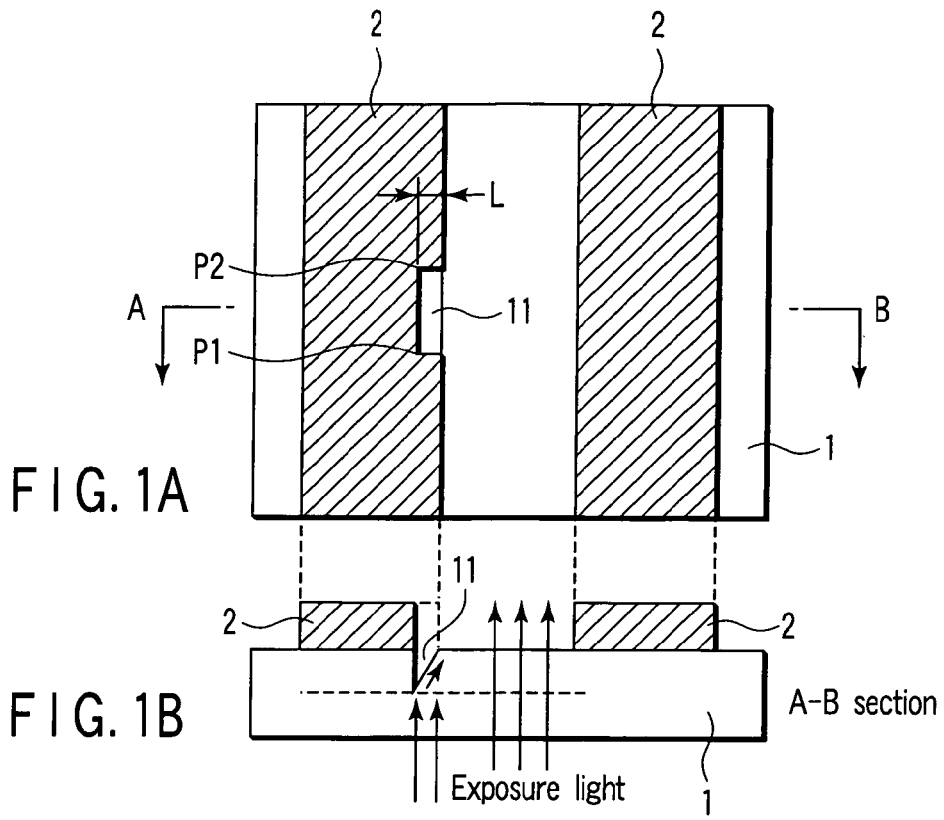
FIG. 1A
FIG. 1B
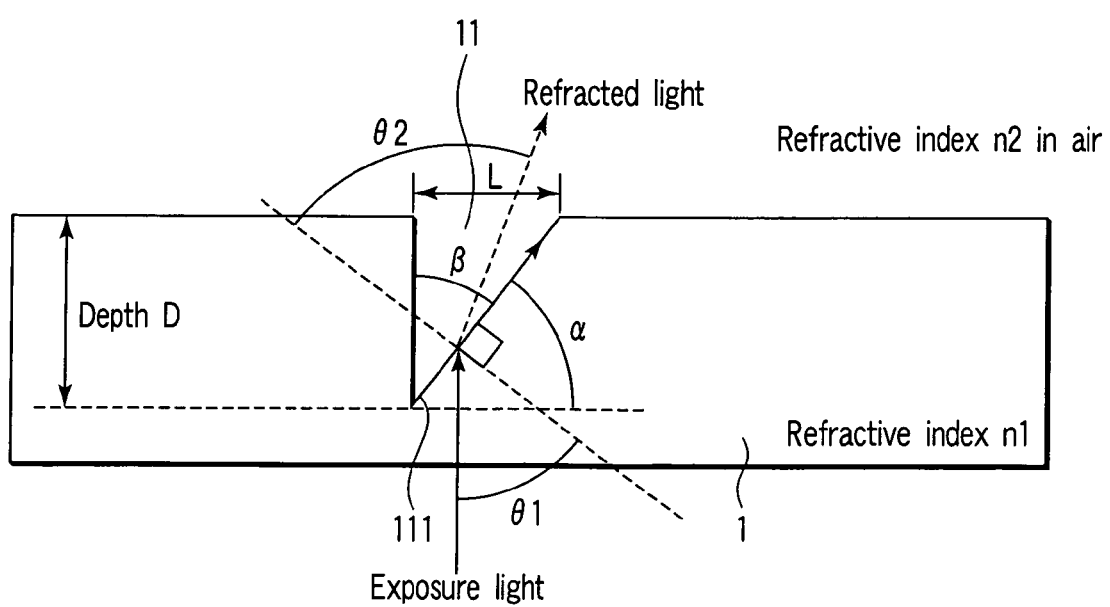
FIG. 2

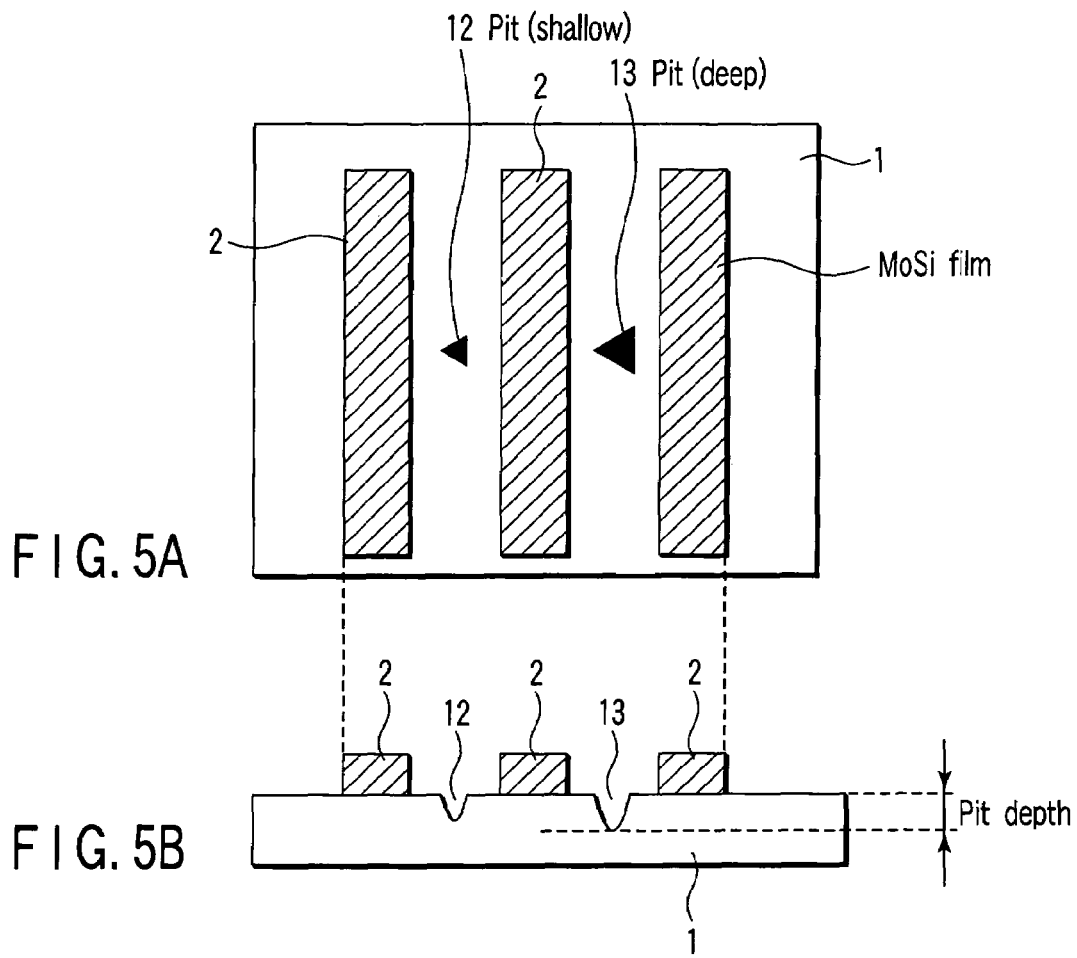
FIG. 5A
FIG. 5B
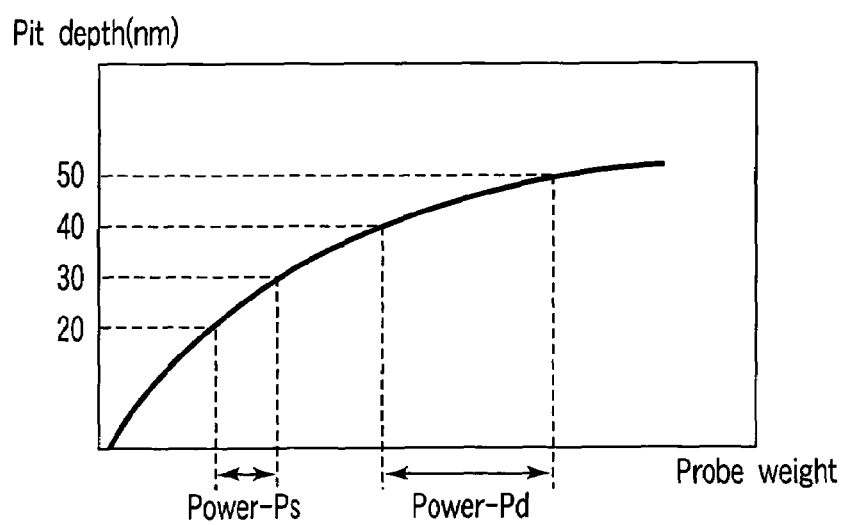
FIG. 6

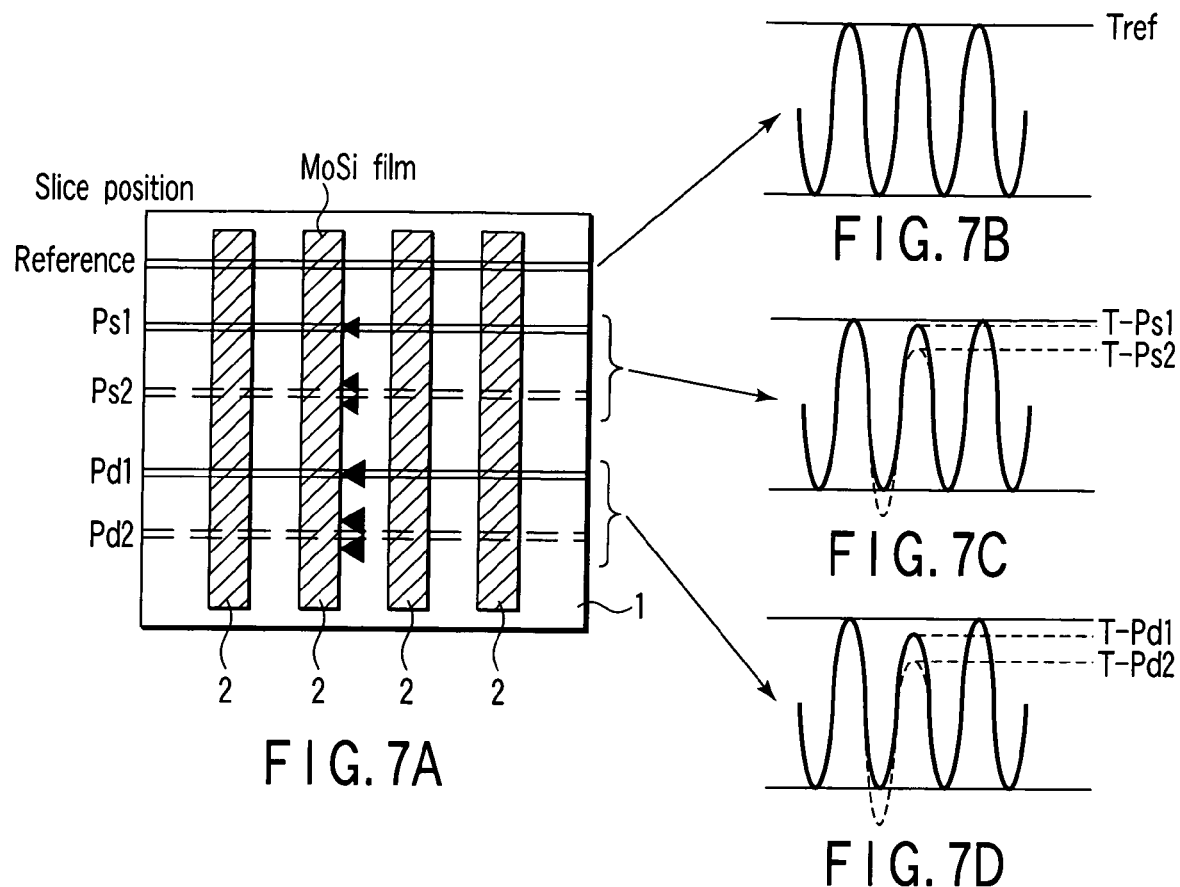
FIG. 7A
FIG. 7B
FIG. 7C
FIG. 7D
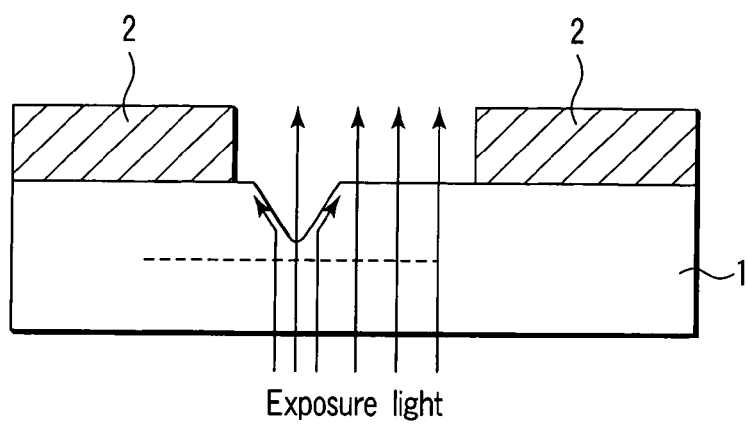
FIG. 8

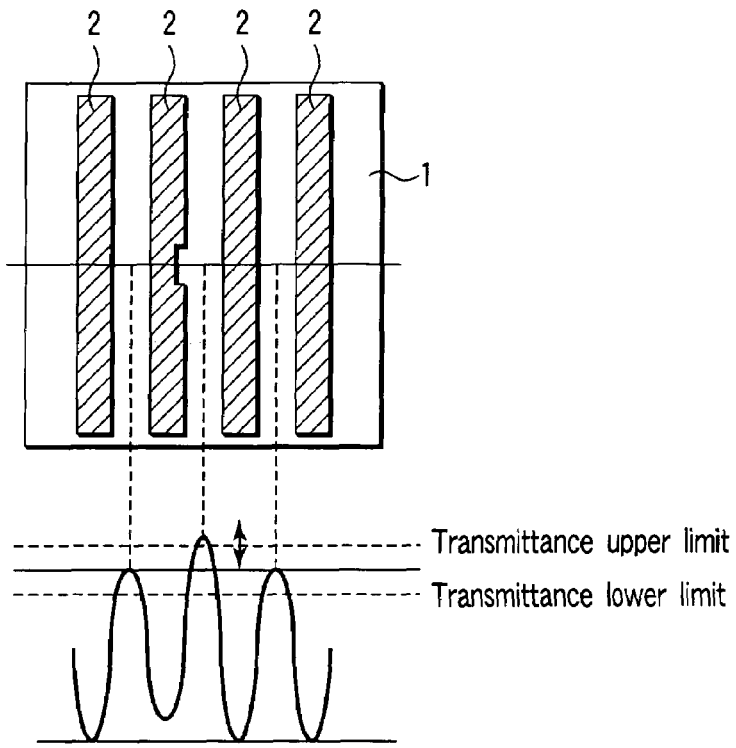
FIG. 9A
FIG. 9B
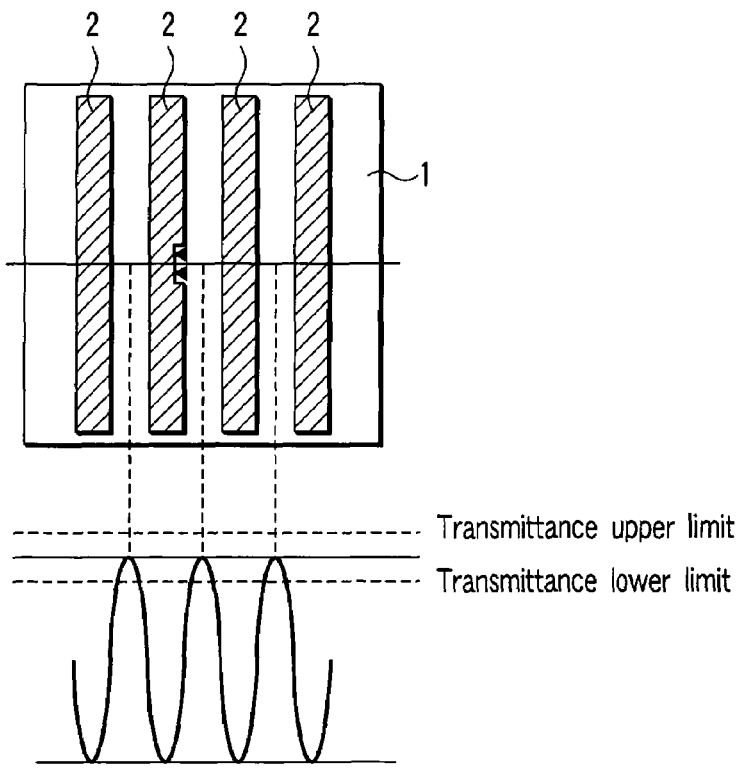
FIG. 10A
FIG. 10B

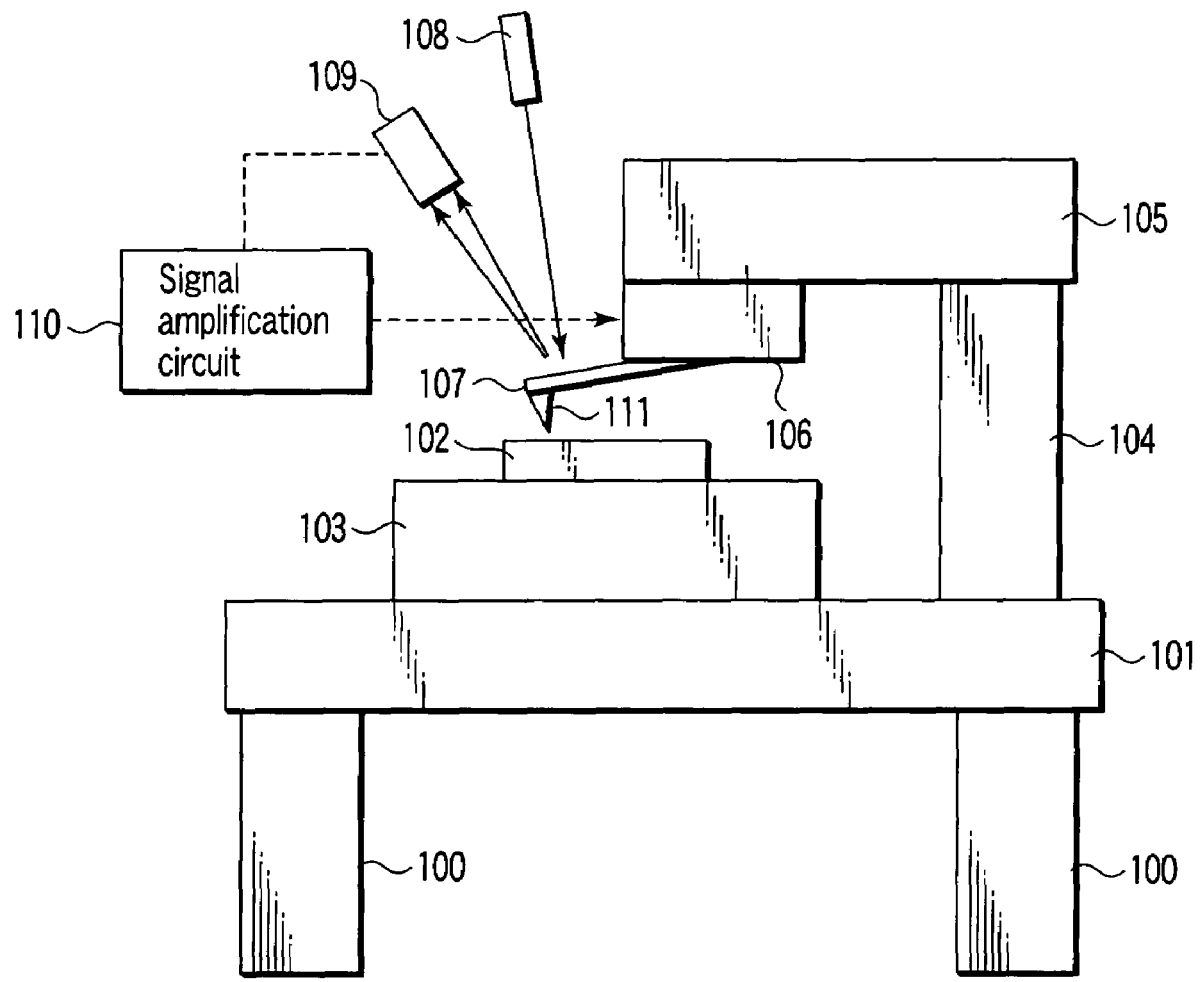
F I G. 12

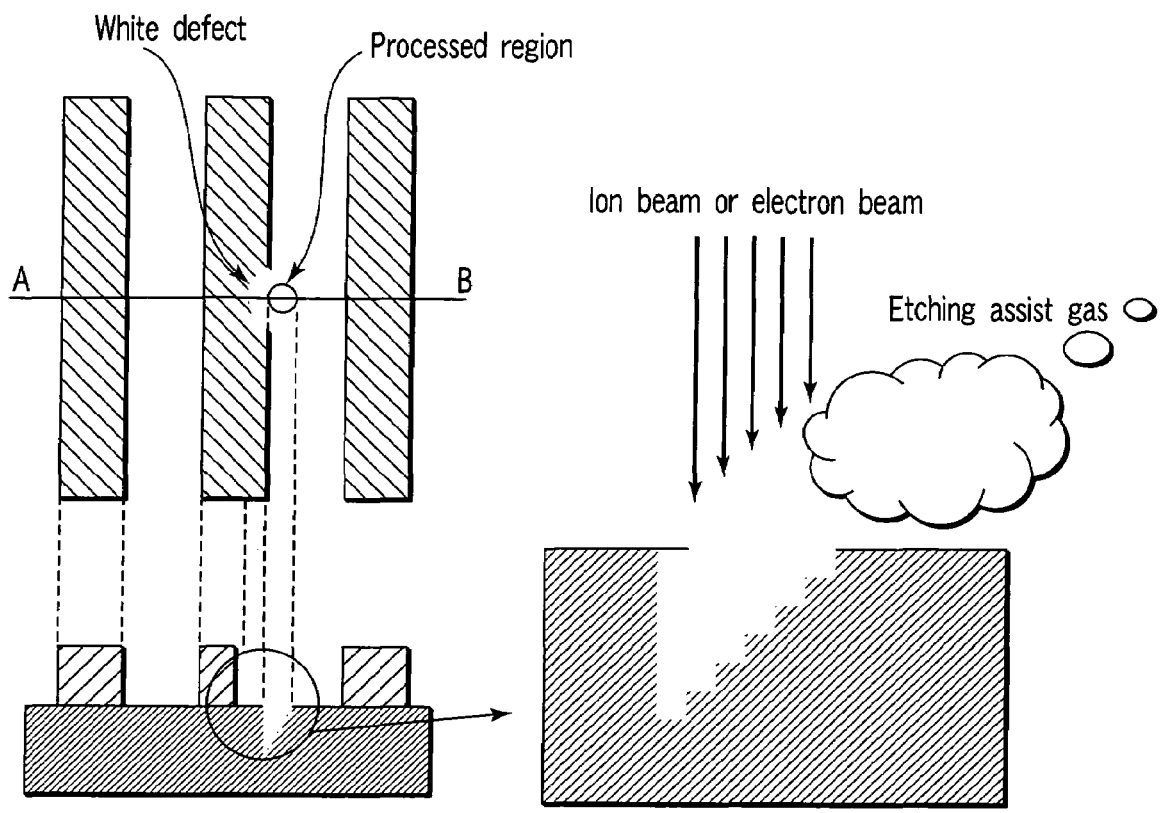
FIG. 13A
FIG. 13B
FIG. 14
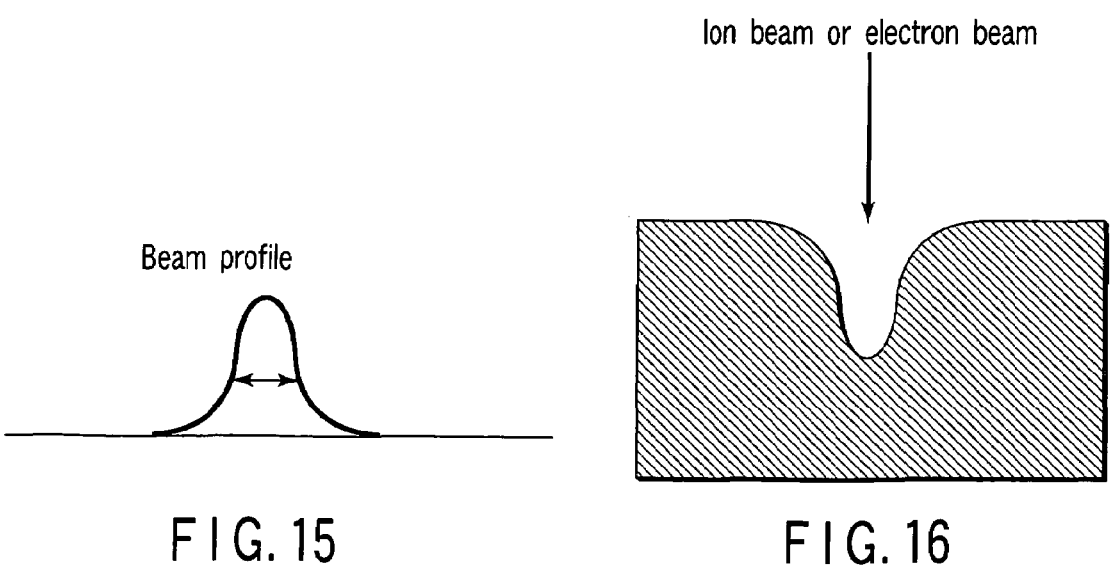
FIG. 15
FIG. 16

WHITE DEFECT REPAIRING METHOD AND APPARATUS OF PHOTOMASK, MANUFACTURING METHOD OF PHOTOMASK, AND MANUFACTURING METHOD OF SEMICONDUCTOR DEVICE

CROSS-REFERENCE TO RELATED APPLICATIONS

This application is based upon and claims the benefit of priority from prior Japanese Patent Application No. 2005-366649, filed Dec. 20, 2005, the entire contents of which are incorporated herein by reference.

BACKGROUND OF THE INVENTION

1. Field of the Invention

The present invention relates to white defect repairing method and apparatus of a photomask which repair a white defect generated in a manufacture process of a semiconductor photomask, a manufacturing method of a photomask, and a manufacturing method of a semiconductor device.

2. Description of the Background Art

Heretofore, repair of a white defect of a mask film on a quartz substrate in a photomask for use in manufacture of a semiconductor integrated circuit has been performed by depositing a carbon film on a white defect portion in a focused ion beam repair apparatus (hereinafter referred to as "FIB apparatus") or the like.

In general, one factor to determine a performance of the repair apparatus of the photomask is an alignment precision during the repair, that is, a repair precision. The repair precision improves with improvement of the apparatus, but on the other hand, miniaturization and precision of devices also advance. Therefore, in all generations, the sufficient precision has not been achieved. That is, a necessary level of the repair precision has not been achieved yet in a period where such a necessary level is required.

Pass or fail of a repaired trace is usually judged by inspection with an image quality evaluation apparatus having the same wavelength and the same optical system as in an exposure apparatus. A typical example of the evaluation apparatus is an aerial measurement system (AIMS) made by Carl Zeiss, Inc, and this system is capable of making all the same illumination conditions as in the case of the manufacture of the devices. In the pass or fail judgment, a wafer image is taken by use of this AIMS to measure a critical dimension (CD) and an image intensity. In many cases, criterion of the pass is within a fluctuation range of several percent to 10 percent.

When this pass criterion of the AIMS is not satisfied after the white defect is repaired with the FIB apparatus, the FIB repair must be performed again, but in this case, an edge of the carbon film is not easily seen in the image of the FIB apparatus, which makes the additional repair difficult. Therefore, in a case where a position of the film deviates, it is required that the already deposited carbon film is once peeled and the deposition is then performed again. This remarkably decreases a throughput of a repair process. The FIB apparatus has a problem of a damage in taking the image. In a mask for exposure having an exposure wavelength of 193 nm, the number of re-repairs is limited to two or three.

As an another drawback of the white defect repair by the deposition of the carbon film, there is also a problem that an edge skirt of the film referred to as a halo adversely affects an image quality during wafer transfer. In particular, this problem is remarkable in the FIB apparatus having a large beam diameter. In addition, it is impossible to attach the micro carbon film having a diameter equal to or less than the beam diameter.

For such a reason, there are also investigated repair methods in which the FIB apparatus is used but any carbon film is not deposited. They correspond to methods described in Jpn. Pat. Appln. KOKAI Publication No. 2003-121991 titled "White Defect Repair Method of Photomask" and the like. However, in these methods, the influence of the halo on the image quality decreases, but a conventional problem remains unsolved in that the re-repair must be performed in a case where the pass criterion is not satisfied after the repair. That is, it is impossible to judge a portion of the image to be next repaired by the FIB apparatus during the re-repair. Moreover, the repair precision itself does not exceed a range of a basic precision of the FIB apparatus.

BRIEF SUMMARY OF THE INVENTION

According to an aspect of the invention, there is provided a white defect repairing method of a photomask which repairs a white defect present at an edge portion of a pattern of the photomask, the method comprising: forming a groove or a hole having a tilted side wall which inhibits passage of exposure light at a position corresponding to that of the white defect on a translucent substrate of the photomask.

According to another aspect of the invention, there is provided a white defect repairing apparatus of a photomask which repairs a white defect present at an edge portion of a pattern of the photomask, the apparatus comprising: a probe; a movement means which moves the probe onto a translucent substrate of the photomask; an image acquisition means which acquires an image on the surface of the translucent substrate via the probe moved by the movement means; and a mechanism which specifies a repair position of the white defect based on the image acquired by the image acquisition means and which forms a groove or a hole having a tilted side wall to inhibit passage of exposure light at a position on the translucent substrate corresponding to the specified position.

According to another aspect of the invention, there is provided a manufacturing method of a photomask, comprising: forming a groove or a hole having a tilted side wall to inhibit passage of exposure light at a position corresponding to a white defect present at an edge portion of a pattern of the photomask on a translucent substrate of the photomask to repair the defect, thereby manufacturing the photomask.

According to another aspect of the invention, there is provided a manufacturing method of a semiconductor device, comprising: forming a circuit pattern on a semiconductor substrate by use of a photomask in which a groove or a hole having a tilted side wall to inhibit passage of exposure light is formed at a position corresponding to a white defect present at an edge portion of a pattern of the photomask on a translucent substrate of the photomask to repair the defect, thereby manufacturing the semiconductor device.

BRIEF DESCRIPTION OF THE SEVERAL VIEWS OF THE DRAWING

FIGS. 1A and 1B are diagrams showing repair by a side wall tilt groove in a first embodiment;

FIG. 2 is an enlarged view showing the repair by the side wall tilt groove in the first embodiment;

FIGS. 5A and 5B are diagrams showing formation of holes (pits) in the second embodiment;

FIG. 6 is a diagram showing a relation between a weight to be applied to the probe and a depth of each pit according to the second embodiment;

FIGS. 7A, 7B, 7C and 7D are a plan view of a photomask showing pit samples and AIMS profiles according to the second embodiment;

FIG. 8 is a sectional view of the photomask showing a drop of transmittance due to the pit according to the second embodiment;

FIGS. 9A and 9B are a plan view of a photomask showing a white defect of a processing object and an AIMS profile according to the second embodiment;

FIGS. 10A and 10B are a plan view of a photomask showing a repaired image and an AIMS profile according to the second embodiment mask;

FIG. 12 is a side view showing a configuration of an AFM repair apparatus according to the first and second embodiments;

FIGS. 13A and 13B are diagrams showing repair by a side wall tilt groove in a third embodiment;

FIG. 14 is an enlarged view showing the repair by the side wall tilt groove in the third embodiment;

FIG. 15 is a diagram showing a beam profile according to the third embodiment; and FIG. 16 is a diagram showing a pinhole according to the third embodiment.

DETAILED DESCRIPTION OF THE INVENTION

Embodiments will be described hereinafter with reference to the drawings.

In a photomask for use in manufacture of a semiconductor integrated circuit, it is demanded to repair all defects having influences during transfer onto a wafer. The defects include a white defect which is a deletion defect that a pattern that should originally exist is not present, and a black defect that an unnecessary pattern is present at a position where any pattern should not originally exist. The present embodiment is applied to the repair of the white defect generated in a phase shift mask, a COG mask or the like.

FIGS. 1A and 1B are diagrams showing repair by a side wall tilt groove in a first embodiment, and FIG. 1A is a plan view of the photomask and FIG. 1B is a sectional view thereof. FIG. 2 is an enlarged view of FIG. 1B. In this first embodiment, as shown in FIGS. 1A and 1B, white defects generated in pattern edges of mask films 2 on a quartz substrate (a Qz substrate or a translucent substrate) 1 are repaired by forming a groove 11 having a tilted side wall (a side surface) in the quartz substrate 1.

It is experimentally indicated that when a portion such as the groove 11 is formed, a drop of transmittance actually occurs. As a reason for this, an effect of scattering or refraction of light or the like is considered. A behavior at the portion of the refraction is considered as follows, whereby a groove to interrupt the light more effectively can be formed.

In FIG. 2, the Snell's law of refraction "$n_1 \sin \theta_1 = n_2 \sin \theta_2$" is utilized where $\theta_1$ is an incident angle of exposure light which is incident on the groove 11 and $\theta_2$ is an exit angle of refracted light which is refracted at the groove 11 and exited. Now, a quartz refractive index $n_1=1.56$ and an air refractive index $n_2=1$ at a wavelength $\lambda=193$ nm are substituted in the Snell's law to obtain $\theta_1$ in a case that $\theta_2$ is 90°. As a result, $\theta_1=39.9°$ is obtained. Therefore, in the groove 11 in which a side wall 111 has a rising angle (a side wall angle) $\alpha$ of 40° or more, the exposure light which has been incident on the side wall 111 is reflected as in total reflection, and cannot reach the surface of the quartz substrate 1. That is, the groove 11 functions as a shielding structure in the same manner as in a carbon film. An example of the white defect repair of the photomask by use of this principle will be described hereinafter.

First, the photomask in which the white defect exists at an edge portion of the pattern is set on an atomic force microscope (AFM) repair apparatus (manufactured by SII Nano Technology, Inc.). In this apparatus, a probe is moved to a defect position in the mask surface based on defect coordinate data.

Figure 3A:
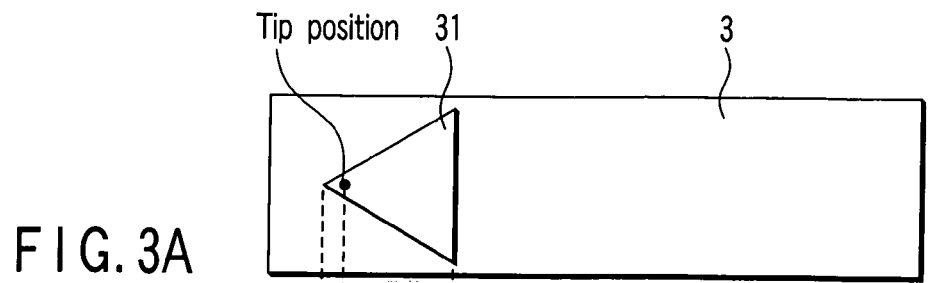
FIGS. 3A and 3B are diagrams showing a probe for use in processing for defect repair according to the first embodiment.
Figure 3B:
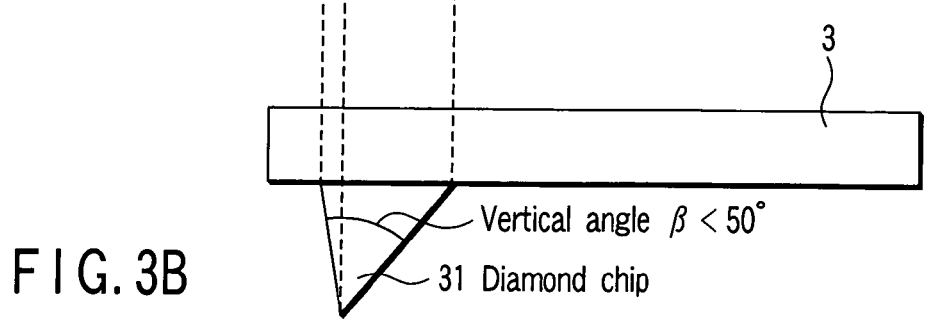

FIGS. 3A and 3B are diagrams showing the probe of the AFM repair apparatus for use in processing for defect repair according to the first embodiment, and FIG. 3A is a plan view and FIG. 3B is a side view. In this probe, a diamond chip (a probe) 31 having a triangular pyramid shape is attached to a cantilever 3, and a position of a vertex of the diamond chip 31 is shifted to one side as shown in FIGS. 3A and 3B. The diamond chip 31 has a vertical angle $\beta$ of 50° or less, and two surfaces thereof are substantially vertically raised. Such a tip shape can easily be formed by milling with an FIB apparatus. As the diamond chip 31, there is used a chip which does not have any attached matter such as cutting wastes on its tip and which has not been worn owing to repetition use and which is sharpened as much as possible. That is, the diamond chip 31 is a probe for exclusive use in executing the first embodiment.

Next, in control software of the AFM repair apparatus, a set value of a cutting depth D from the surface of the quartz substrate 1 is set to about L×tan $\alpha$ where L is a width of the white defect. Subsequently, a range of P1 to P2 of FIG. 1A is scanned by the probe to form the groove 11. Thus, as shown in FIG. 2, the shielding structure having a width L, a depth D and a side wall angle $\alpha$ of 40° or more (i.e., an angle $\beta$ formed by the side wall 111 of the groove 11 and a normal to the surface of the quartz substrate 1 is 50° or less) can be formed in a white defect portion. Subsequently, the cutting wastes are removed, and a repair state is confirmed with an AIMS. The repair of the white defect of the photomask is completed in this manner.

In the first embodiment, as shown in FIGS. 1A and 1B, one groove is formed at the position of the white defect so that a defect area is approximately equal to an area of projection on the side wall of the groove. Such processing is possible with the AFM repair apparatus, but in a second embodiment, processing by pressing of the probe will be described as a simpler processing method.

Figure 4A:
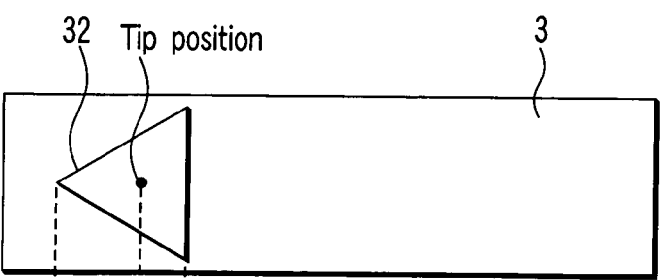
FIGS. 4A and 4B are diagrams showing a probe for use in processing for defect repair according to a second embodiment.
Figure 4B:
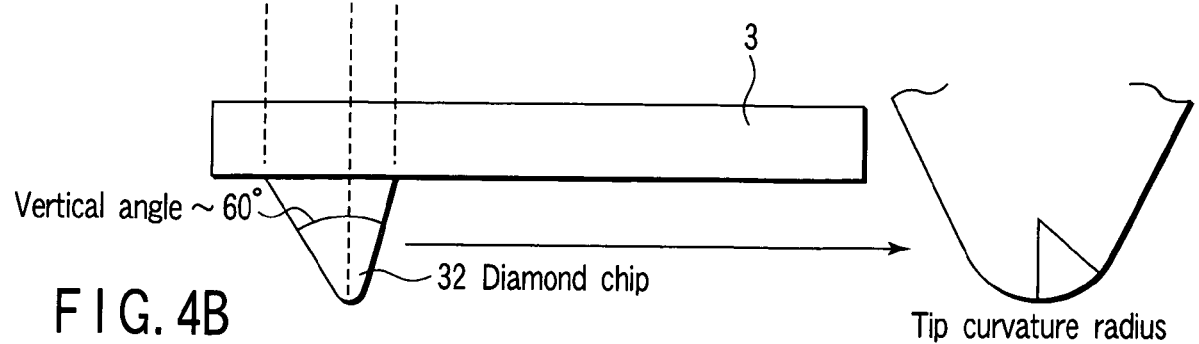

FIGS. 4A and 4B are diagrams showing a probe of an AFM repair apparatus for use in processing for defect repair according to the second embodiment, and FIG. 4A is a plan view and FIG. 4B is a side view. In this probe, a diamond chip 32 is usually used which is a symmetric probe for use in cutting repair of a black defect. The symmetric probe usually has a triangular pyramid shape, and three ridges thereof have a constant length and a vertical angle of about 60°. When an exposure wavelength is 193 nm, the symmetric probe having a vertical angle of 110° or less is usable to perform a method of the second embodiment, and any probe may be used, as long as it can more effectively form a groove in this vertical angle range.

In general, the probe having a smaller vertical angle is suitable for a defect having a smaller area, and is considered to be advantageous to additional processing. In the second embodiment, the probe for black defect processing is used as it is so that a throughput does not decrease owing to exchange of the probe or the like. During the processing, a defect position is designated on an image, and a weight is applied to the probe to press the probe, whereby a hole or a groove is formed in a quartz substrate.

In the AFM repair apparatus, when the probe is pressed onto the quartz substrate to process the substrate, a hole having a triangular pyramid shape is formed, but a rising angle α of each side wall is 40° or more. Therefore, projection of each side wall onto the surface of the quartz substrate 1 interrupts exposure light. These holes are arranged to thereby form a shielding area. In a phase shift mask, the groove does not have any phase shift effect, and hence complete repair is impossible. However, a position and a depth of each hole may be adjusted by an AIMS so that a pass criterion is satisfied.

An actual problem in executing the second embodiment lies in that each hole has a triangular pyramid shape and additionally a tip of the probe is usually rounded with a curvature radius of 25 nm or less as enlarged in FIG. 4B, and hence a translucent portion is inconveniently formed in a bottom surface of the formed hole. Moreover, this tip is worn during use, with the result that processing conditions are also affected. To perform the repair more securely, if necessary, two preliminary processes are performed.

FIGS. 5A and 5B are diagrams showing formation of holes (pits) in the second embodiment, and FIG. 5A is a plan view of a photomask and FIG. 5B is a sectional view.

In the first preliminary process, there are beforehand obtained power conditions for obtaining a necessary processing depth in accordance with a size of a white defect. As shown in FIGS. 5A and 5B, a strength of a force to press the probe is changed to form several types of pits 12, 13 in a quartz substrate 1. After forming the pits 12, 13, the area is again scanned with the AFM repair apparatus to acquire a three-dimensional image, whereby depths of the pits 12, 13 can be grasped. In such a manner, conditions of the force to press the probe are changed to prepare several types of pit samples.

FIG. 6 is a diagram showing a relation between a weight to be applied to the probe and the depth of each pit. After the above pit samples are prepared, the conditions of the applied force are associated with the depths of the pits as shown in FIG. 6, and then there are determined conditions necessary for a case where the depth of the pit is as shallow as 20 to 30 nm and a case where the depth of the pit is as deep as 40 to 50 nm. For the sake of convenience of the description, in the present specification, the above shallow pit is referred to as Ps, and the deep pit is referred to as Pd. In addition, as shown in FIG. 6, a power condition to obtain the shallow pit is referred to as Power-Ps, and a power condition to obtain the deep pit is referred to as Power-Pd. The power condition mentioned herein is a probe pressing force which can usually be defined on the basis of a deflection amount of a cantilever and a hardness of the lever.

In a configuration of the AFM repair apparatus, in addition to Power-Ps and Power-Pd, a series of conditions required for pit processing such as vibration conditions are set as a recipe and managed by software. That is, an operator can form the pits by a simple operation without performing any especially complicated operation.

In the second preliminary process, there is beforehand estimated an influence of the pits on a drop of transmittance in accordance with a pattern size and exposure conditions of the mask required to be repaired. In this case, inspection is performed using a test pattern made with the same design as that of a pattern to be actually repaired.

FIG. 7A is a plan view of a photomask showing pit samples. First, as shown in FIG. 7A, a position where a pit is to be formed is set close to an edge of a pattern, and the power conditions Power-Ps and Power-Pd are used to form four types of pit samples in total at each portion and two adjacent portions. In the second embodiment, four pit combinations of shallow/deep pits and one pit/two pits are present, but these combinations are not restrictive.

For the sake of convenience of the description, in the present specification, these pit samples are referred to as Ps1, Ps2, Pd1 and Pd2. The Ps1 includes one shallow pit sample, the Ps2 includes two shallow pit samples, the Pd1 includes one deep pit sample, and the Pd2 includes two deep pit samples. These pit samples are cleaned to completely remove processing wastes generated in the pit formation, and image quality is then measured with the AIMS.

FIGS. 7B, 7C and 7D are diagrams showing AIMS profiles. In an image picked up by the AIMS, for a portion (Reference) where any pit is not formed and portions (Ps1, Ps2, Pd1 and Pd2) where the pits are formed as shown in FIG. 7A, if a light intensity distribution is taken in a lateral direction of the drawing sheet, light intensity profiles (Tref, T-Ps1, T-Ps2, T-Pd1 and T-Pd2) of FIGS. 7B, 7C and 7D are obtained, respectively. In consequence, when each pit has a triangular pyramid shape instead of an ideal groove shape, it is possible to grasp a degree of the transmittance drop owing to the conditions of the pit depth and the number of the pits.

FIG. 8 is a sectional view of the photomask showing the drop of transmittance due to the pit. The light intensity profiles of FIGS. 7B, 7C and 7D include an effect that exposure light is slightly transmitted in a case where a bottom portion of the pit is partially flattened by roundness of the tip of the diamond chip which is the probe as shown in FIG. 8.

FIG. 9A is a plan view of a photomask showing a white defect of a processing object, and FIG. 9B is a diagram showing an AIMS profile. FIG. 10A is a plan view of the photomask showing a repaired image, and FIG. 10B is a diagram showing an AIMS profile.

After the preliminary process is performed as described above, the power and the number of the pits required for repair of the photomask shown in FIG. 9A are estimated, and the pit may be processed at an actual white defect position. When the white defect is beforehand measured with the AIMS and the profile is obtained as shown in FIG. 9B, a surplus of the transmittance can be confirmed.

The depth (the size) of the pits and the number of the pits required for offsetting this surplus are estimated with reference to FIGS. 7B, 7C and 7D. When the Ps2 of FIG. 7A is picked up and actually processed, an example of the repair can be obtained as shown in FIG. 10A. The processing wastes are completely removed from this repaired portion, and the AIMS measurement is then performed. If a result of the AIMS measurement satisfies the pass criterion as shown in FIG. 10B, the repair is completed. When the size of the pit is insufficient and does not satisfy the pass criterion, the photomask may be set to the AFM repair apparatus again to process a pit portion more deeply. In this case, since the pit is constantly formed into such a shape as to trace the probe shape, a tilted side wall portion simply enlarges.

Figure 11:
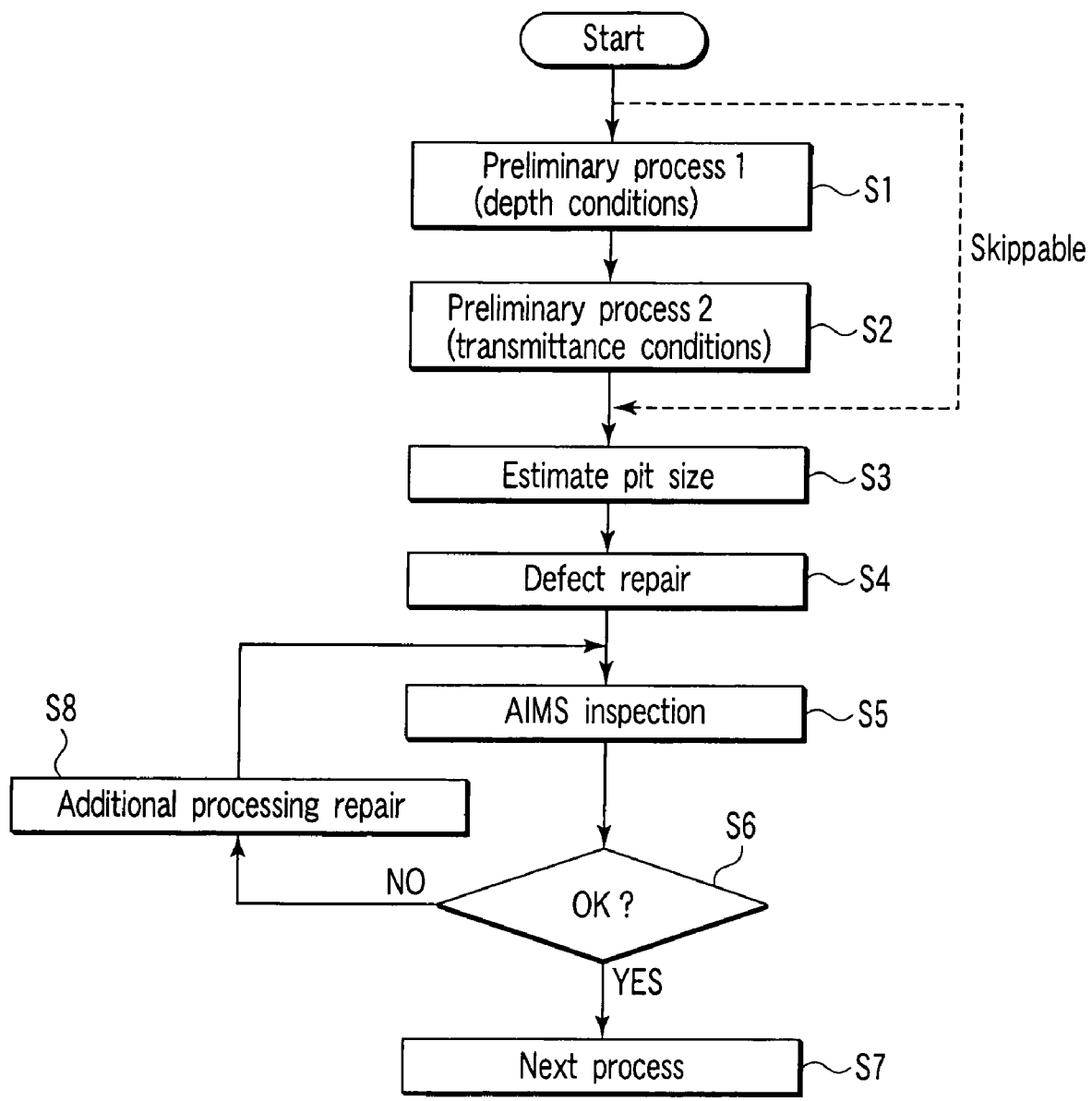
FIG. 11 is a flow chart showing a procedure of defect repair according to the second embodiment.

FIG. 11 is a flow chart showing a procedure of the defect repair according to the second embodiment. The procedure of the defect repair will be hereinafter described with reference to FIG. 11. First, in a step S1, the first preliminary process is performed. The second preliminary process is performed in a step S2. The size of the pits and the number of the pits are estimated in a step S3, and then the white defect is repaired in a step S4.

After the repair, the AIMS measurement is performed in a step S5. If the result of the measurement satisfies the pass criterion in a step S6, the procedure progresses to the next step in a step S7. If the result of the AIMS measurement does not satisfy the pass criterion in the step S6, additional processing repair is performed in a step S8, and the procedure returns to the step S5.

It is to be noted that the two preliminary processes can be omitted in a case where a tendency can beforehand be grasped. Even if the tendency cannot be grasped, instead of the first preliminary process, a method may be employed in which observation and pit formation are repeated with the AFM repair apparatus, and the processing is ended when a necessary depth is obtained. Instead of the second preliminary process, small pits may first be formed, and the AIMS measurement and the additional processing may be repeated.

It is to be noted that in the method of the second embodiment, a defect portion is covered with the shielding structure, and hence a phase effect is not present. Therefore, when an object of the repair is the phase shift mask, a defocus characteristic of a repaired portion is different from that of a normal portion. A degree of this difference depends on an original size of the white defect. If the white defect is small to a certain degree, its influence can be ignored, and this method can be applied as it is. However, it can be considered that the large white defect becomes NG during defocus. Therefore, when the repair object is the phase shift mask, the size of the defect to be repaired is limited in an allowable range of the defocus characteristic to perform the repair.

FIG. 12 is a side view showing a configuration of a general AFM repair apparatus. As shown in FIG. 12, an active vibration-free base 101 is supported by a plurality of supports 100, and an X-Y stage 103 on which a photomask 102 as a repair object is to be mounted is installed on the active vibration-free base 101. Above the active vibration-free base 101, a Z-axis coarse movement mechanism 105 and an X, Y and Z micro movement mechanism 106 are arranged via a support 104, and a cantilever 107 is attached to the X, Y and Z micro movement mechanism 106. Above the photomask 102, a laser light source 108 and an optical lever detecting section 109 are arranged. The optical lever detecting section 109 is connected to the X, Y and Z micro movement mechanism 106 via a signal amplification circuit 110.

Hereinafter, an operation order of the AFM repair apparatus will be described with reference to FIG. 12. It is to be noted that the following operation is performed by a control of a control section (not shown).

First, the X-Y stage 103 is moved with reference to a coordinate of a white defect on the photomask 102 so that the white defect is positioned right under a probe 111 attached to the cantilever 107. Next, the probe 111 is rapidly brought close to the surface of the photomask 102 by use of the Z-axis coarse movement mechanism 105. At this time, when the probe 111 detects an inter-atomic force, the Z-axis coarse movement mechanism 105 stops, and instead, the X, Y and Z micro movement mechanism 106 operates and then stops so that a distance between the probe 111 and the surface of the photomask 102 is correctly constantly kept. An approach process ends in this manner.

Next, while an area of several micrometers on the surface of the photomask 102 is scanned by the probe 111, a three-dimensional image on the surface of the photomask 102 is taken. In general, the inter-atomic forces of the probe 111 and the surface of the photomask 102 change owing to concave and convex portions of the surface of the photomask 102, whereby a deflection amount of the cantilever 107 changes. In a mechanism to take the image, the laser light source 108 first emits laser light to the cantilever 107, and the laser light reflected by the cantilever 107 is received by the optical lever detecting section 109. The optical lever detecting section 109 grasps the deflection amount of the cantilever 107 from the received laser light by a detection system using an optical lever. A signal indicating this deflection amount is amplified by the signal amplification circuit 110, and fed back to the X, Y and Z micro movement mechanism 106. Furthermore, the control section can allow a computer (not shown) to generate a three-dimensional image on the surface of the photomask 102 based on the signal indicating the deflection amount. Such an apparatus configuration is a configuration of the general AFM, and a similar operation is possible even in a configuration in which a cantilever of a self detection system is used instead of deflection detection of an optical lever system. The configuration depends partially on a manufacturer, but if any large difference of the operation is not present, the above first and second embodiments can be performed.

In the above operation, there can roughly be considered three types of scan modes including a contact mode in which the sharp probe 111 is continuously brought into contact with the surface of the photomask 102 during the scanning, a cyclic contact mode in which the probe is intermittently brought into contact, and a non-contact mode in which the probe is not brought into contact. In any of these modes, the mask can be prevented from being damaged by adjustment of parameters.

After the image including the defect portion is acquired in this manner and a repair position of the white defect is specified from this image, the repair is made. To repair the white defect, the probe 111 is correctly moved to the defect position by use of the X, Y and Z micro movement mechanism 106, a predetermined force is applied to the cantilever 107, and the defect repair is performed by the above-described groove or hole formation. Subsequently, cutting wastes scatter on the spot, but the wastes can be removed with a dry cleaning apparatus using $CO_2$. A series of defect repairs are completed in this manner. It is to be noted that a series of processing parameters for processing the groove or the hole having the necessary size in accordance with the size of the white defect can be stored in a memory to thereby automatically perform a series of repair procedures.

FIGS. 13A and 13B are diagrams showing repair by a side wall tilt groove in a third embodiment, and FIG. 13A is a plan view of a photomask and FIG. 13B is a sectional view thereof. FIG. 14 is an enlarged view of FIG. 13B. The third embodiment using an FIB apparatus or an electron beam repair apparatus will hereinafter be described.

First, a CD fluctuation generated by a white defect on the photomask is predicted with an AIMS or the like, and then a processing size and a shape required for a shielding structure are obtained. Next, the photomask is set on the repair apparatus, an image having an appropriate size is acquired, and a processing region is designated. In a case where this processing region is large to a certain degree with respect to a beam diameter, the region is processed with a beam dosage in accordance with a necessary depth while shifting a beam irradiation position as shown in FIG. 14, whereby a stair-like shape can be formed. Scanning is finely performed with a beam so that stair steps are reduced without any problem, whereby a hole or a groove having a tilted side wall can be formed. When the beam is an electron beam, an etching gas represented by xenon fluoride is used. On the other hand, since an ion beam repair apparatus has a sputtering function, a process using an etching assist gas such as xenon fluoride may be acceptable, or a process in which any assist gas is not used may be acceptable.

Next, there will be described an example of a case where a necessary processing region may be very small. As shown in FIG. 15, a charged particle beam necessarily has a certain degree of beam spread. A size of the beam changes to any degree owing to a relation between a current amount and an acceleration voltage and further a problem of lens design, but an ion beam is generally larger than an electron beam. For example, in the existing ion beam repair apparatus, the size is estimated to be about 30 nm to 50 nm in a half value width. When a certain amount of this beam is implanted into a quartz substrate without scanning, such a pinhole that this shape is inverted can be formed as shown in FIG. 16. Needless to say, a side wall of this hole tilts, and functions as a shielding structure of the present embodiment.

In this method, when a beam profile is not so sharp and a shape has a large skirt spread, a great function can be obtained as a shielding article, and hence it can be considered that the ion beam is more effective than the electron beam. In an existing device having a half pitch of 55 nm to 70 nm for a mask dimension of 220 nm to 280 nm, such a hole can conveniently be formed by the ion beam to easily bring a CD fluctuation of about several percent. To correctly give a necessary CD fluctuation, scanning is performed as much as several steps each of which is about 10 nm in vertical and lateral directions, whereby fine adjustment is possible.

If a device node further advances and a much smaller shielding article is required in future, there is a possibility that the repair method by the electron beam is indispensable.

As described above, according to the respective embodiments, the pattern white defect of the photomask is repaired by forming the groove or the hole having the tilted side wall at a position corresponding to that of the white defect on the quartz substrate, instead of a conventional method of covering a missing portion with a film formed by deposition with the FIB apparatus. The exposure light which has struck on the side wall of the groove or the hole is reflected as in total reflection and inhibited from being transmitted. Since the light cannot reach the substrate surface, eventually excess exposure light is partially interrupted, and there is obtained the same effect as in a case where the missing portion is covered with a shielding film.

The groove or the hole having the tilted side wall is formed by pressing the probe having the sharp tip onto the quartz substrate by use of the AFM repair apparatus. As a method of performing the repair more securely, after predicting a decrease of a pattern dimension caused by the white defect during the wafer transfer with the AIMS, a drop of a quantity of light to be transmitted for repairing an influence degree of the defect is estimated, and the groove or the hole having the size in accordance with the drop is formed in the quartz substrate to thereby obtain a desired pattern dimension during the wafer transfer.

In consequence, unlike the repair of the carbon film with the FIB apparatus, the white defect repair is possible without any deposition film skirt referred to as a halo, and it is possible to eliminate the influence on the image quality which is considered to be caused by the halo. Since the repair is not performed by the film formation, a problem of the quality such as film peeling by a cleaning process does not occur.

Moreover, since the white defect repair is performed using the AFM repair apparatus, a repair precision is high and a processing time is short as compared with the repair by the general FIB apparatus. Since the depth of the groove or the hole is controlled to determine the shielding region, a fine control is possible. Furthermore, a finished state after the defect repair can be predicted, a ratio to perform re-repair decreases, and it is possible to reduce as much as possible NG of the repair caused by excessive digging of the groove or the hole.

When a circuit pattern is formed on a semiconductor substrate by use of the photomask in which the defect has been repaired as described above, a semiconductor device can be manufactured.

According to the present embodiments, there can be provided white defect repairing method and apparatus of a photomask, a manufacturing method of a photomask, and a manufacturing method of a semiconductor device in which there is not any influence on an image quality during transfer and a high repair precision is achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A white defect repairing method of a photomask which repairs a white defect present at an edge portion of a pattern of the photomask, the method comprising:
    forming a groove or a hole having a tilted side wall which inhibits passage of exposure light at a position corresponding to that of the white defect on a translucent substrate of the photomask.

2. The white defect repairing method of the photomask according to claim 1, wherein a size of the groove or the hole is beforehand estimated in accordance with a size of the white defect, a size of the pattern and exposure conditions.

3. The white defect repairing method of the photomask according to claim 1, wherein an angle formed by the side wall of the groove and a normal to the surface of the translucent substrate is 50° or less.

4. The white defect repairing method of the photomask according to claim 1, wherein a depth D of the groove is set to L×tan α where α is a rising angle of the side wall of the groove and L is a width of the white defect.

5. The white defect repairing method of the photomask according to claim 1, wherein the hole includes several types of holes.

6. The white defect repairing method of the photomask according to claim 1, wherein the groove or the hole is formed by an AFM repair apparatus.

7. The white defect repairing method of the photomask according to claim 1, wherein the groove or the hole is formed by an FIB apparatus.

8. The white defect repairing method of the photomask according to claim 1, wherein the groove or the hole is formed by an electron beam repair apparatus.

9. The white defect repairing method of the photomask according to claim 8, wherein the groove or the hole is formed in a stair-like shape by shifting a beam irradiation position with the electron beam repair apparatus.

10. A manufacturing method of a photomask, comprising:
    forming a groove or a hole having a tilted side wall to inhibit passage of exposure light at a position corresponding to a white defect present at an edge portion of a pattern of the photomask on a translucent substrate of the photomask to repair the defect, thereby manufacturing the photomask.

11. A manufacturing method of a semiconductor device, comprising:

forming a circuit pattern on a semiconductor substrate by use of a photo mask in which a groove or a hole having a tilted side wall to inhibit passage of exposure light is formed at a position corresponding to a white defect present at an edge portion of a pattern of the photomask on a translucent substrate of the photomask to repair the defect, thereby manufacturing the semiconductor device.

* * * * *